United States Patent
Lin et al.

(10) Patent No.: US 11,175,988 B2
(45) Date of Patent: Nov. 16, 2021

(54) MEMORY STORAGE DEVICE AND DATA ACCESS METHOD

(71) Applicant: Winbond Electronics Corp., Taichung (TW)

(72) Inventors: Lih-Wei Lin, Taichung (TW); Tsung-Huan Tsai, Taichung (TW); Chi-Shun Lin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 13 days.

(21) Appl. No.: 16/831,828

(22) Filed: Mar. 27, 2020

(65) Prior Publication Data
US 2021/0303397 A1 Sep. 30, 2021

(51) Int. Cl.
*G06F 11/10* (2006.01)
*H03M 13/45* (2006.01)
*H04L 1/00* (2006.01)

(52) U.S. Cl.
CPC ....... *G06F 11/1076* (2013.01); *H03M 13/458* (2013.01)

(58) Field of Classification Search
CPC .................. G06F 11/1076; H03M 13/458
See application file for complete search history.

(56) References Cited

U.S. PATENT DOCUMENTS

| | | | |
|---|---|---|---|
| 6,732,288 B2 | 5/2004 | de la Iglesia et al. | |
| 7,187,602 B2 | 3/2007 | Wohlfahrt et al. | |
| 7,502,986 B2* | 3/2009 | O'Neill | G06F 11/10 714/769 |
| 7,876,626 B2 | 1/2011 | Mukai et al. | |
| 8,711,604 B2 | 4/2014 | Kobayashi et al. | |
| 9,081,674 B2* | 7/2015 | Khayat | G11C 11/5642 |
| 9,507,662 B2* | 11/2016 | Andre | G11C 7/1006 |
| 10,481,974 B2* | 11/2019 | Kwok | G11C 16/3418 |
| 2018/0032396 A1* | 2/2018 | Sharon | G06F 3/064 |

* cited by examiner

*Primary Examiner* — Phung M Chung
(74) *Attorney, Agent, or Firm* — JCIPRNET

(57) ABSTRACT

A memory storage device including a memory storage array and a memory controller is provided. The memory storage array is configured to store data. The memory controller is coupled to the memory storage array. The memory controller is configured to write to-be-written data to the memory storage array. The to-be-written data includes a plurality of data bits and a flip bit. The memory controller performs a verification operation on the to-be-written data to determine whether the data bits includes error bits and records information of the error bits. The memory controller, determines, according to a quantity of the error bits, whether to invert parities of the data bits and the flip bit, and records the parity of the flip bit. In addition, a data access method is also provided.

20 Claims, 4 Drawing Sheets

Perform a verification operation on the to-be-written data — S100

Determine, according to a quantity of the error bits, whether to invert parities of the data bits and the flip bit, and records the parity of the flip bit — S110

Write the to-be-written data to the memory storage array — S120

MEMORY STORAGE DEVICE AND DATA ACCESS METHOD

BACKGROUND OF THE INVENTION

1. Field of the Invention

The invention relates to an electronic device and an operating method, and in particular, to a memory storage device and a data access method.

2. Description of Related Art

Generally, data to be written to a non-volatile or a volatile memory may be encoded into code words according to error correcting code (ECC). A corresponding decoding program may also be used to process the code words read from the memory to restore the data. The code words are usually a combination of the data itself and parity bits generated according to the following: Bose-Chaudhuri-Hocquenghem (BCH) code, hamming code, hamming code with extra parity check (SECDED), Reed-Solomon code, Hsiao code, or Lien code.

However, if a correction capability of an ECC engine is stronger (namely, a quantity of correctable error bits is larger), more parity bits are needed. The more parity bits will increase a bit overhead of the data.

SUMMARY OF THE INVENTION

The invention provides a memory storage device and a data access method, to increase a correction capability for error bits in data.

The memory storage device of the invention includes a memory storage array and a memory controller. The memory storage array is configured to store data. The memory controller is coupled to the memory storage array. The memory controller is configured to write the to-be-written data to the memory storage array. The to-be-written data includes a plurality of data bits and a flip bit. The memory controller performs a verification operation on the to-be-written data to determine whether the data bits include error bits and record information of the error bits. The memory controller determines, according to a quantity of the error bits, whether to invert parities of the data bits and the flip bit, and records the parity of the flip bit.

The data access method of the memory storage device of the invention includes: performing a verification operation on to-be-written data, to determine whether a plurality of data bits include error bits and record information of the error bits, where the to-be-written data includes the data bits and a flip bit, and the information of the error bits includes a quantity of the error bits; and determining, according to the quantity of the error bits, whether to invert parities of the data bits and the flip bit, and recording the parity of the flip bit; and writing the to-be-written data to a memory storage array.

To make the features and advantages of the invention clear and easy to understand, the following gives a detailed description of embodiments with reference to accompanying drawings.

DESCRIPTION OF THE EMBODIMENTS

Figure 1:
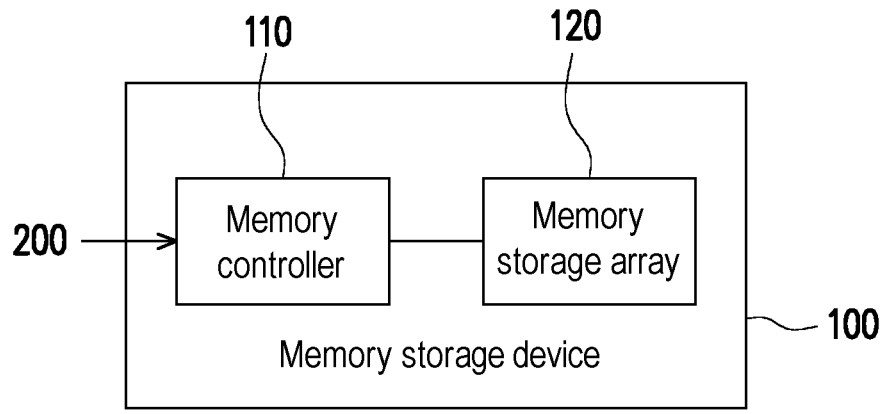
FIG. 1 shows a schematic overview diagram of a memory storage device according to an embodiment of the invention.

FIG. 1 shows a schematic overview diagram of a memory storage device according to an embodiment of the invention. Referring to FIG. 1, the memory storage device 100 of the present embodiment of the invention includes a memory controller 110 and a memory storage array 120. The memory storage array 120 is configured to store data. The memory controller 110 is coupled to the memory storage array 120. The memory controller 110 is configured to perform similar operations such as a write operation, a read operation, and a verification operation on the memory storage array 120.

In the present embodiment, the to-be-written data 200 includes a plurality of data bits and at least one flip bit. The memory controller 110 is configured to write the to-be-written data 200 to the memory storage array 120. The memory controller 110 performs a verification operation on the to-be-written data 200 to determine whether the data bits include error bits and record information of the error bits. The memory controller 110 determines, according to a quantity of the error bits, whether to invert parities of the data bits and the flip bit and records the parity of the flip bit. Next, the memory controller 110 writes the to-be-written data 200 to the memory storage array 120. In the present embodiment, the parities of the data bits and the flip bit of the data (written data) stored in the memory storage array 120 may have been inverted or have not been inverted.

In the present embodiment, the memory controller 110 may be a processor with a computation capability. Alternatively, the memory controller 110 may be a hardware circuit designed by using a hardware description language (HDL) or any other digital circuit design manner known by a person of ordinary skill in the art, and implemented by using a field programmable gate array (FPGA), a complex programmable logic device (CPLD) or an application-specific integrated circuit (ASIC). In the present embodiment, for the hardware structure and implementation of the memory storage array 120, sufficient demonstrations, suggestions, and implementation descriptions may be obtained from the ordinary skill in the art. Therefore, details are not described.

Figure 2:
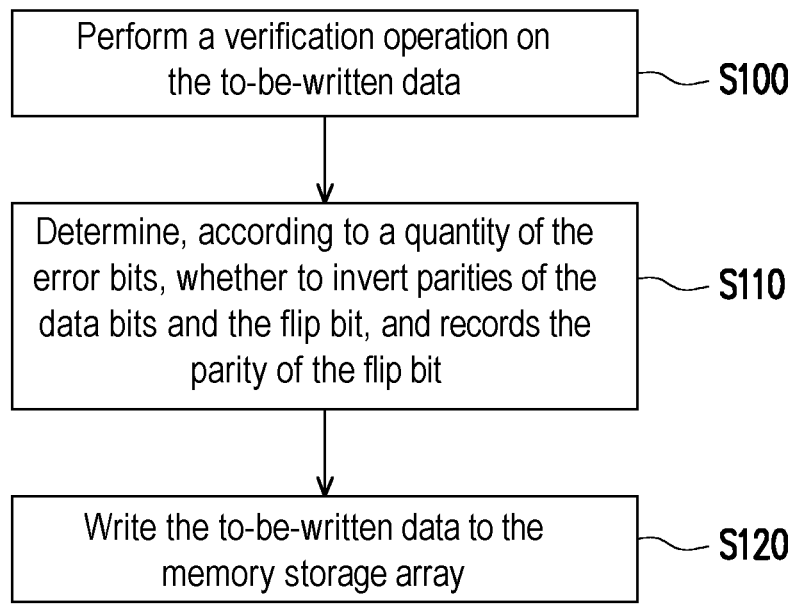
FIG. 2 shows a step flowchart of a data access method according to an embodiment of the invention.

FIG. 2 shows a step flowchart of a data access method according to an embodiment of the invention. The data access method of the present embodiment is at least applicable to the memory storage device 100 in FIG. 1, which is not limited in the invention. Referring to FIG. 1 and FIG. 2, in step S100, the memory controller 110 performs a verification operation on the to-be-written data 200 to determine whether the data bits of the to-be-written data 200 include error bits and record information of the error bits. In step S110, the memory controller 110 determines, according to a quantity of the error bits, whether to invert parities of the data bits and the flip bit, and records the parity of the flip bit. In step S120, the memory controller 110 writes the to-be-written data 200 to the memory storage array 120 to obtain the written data.

Figure 3:
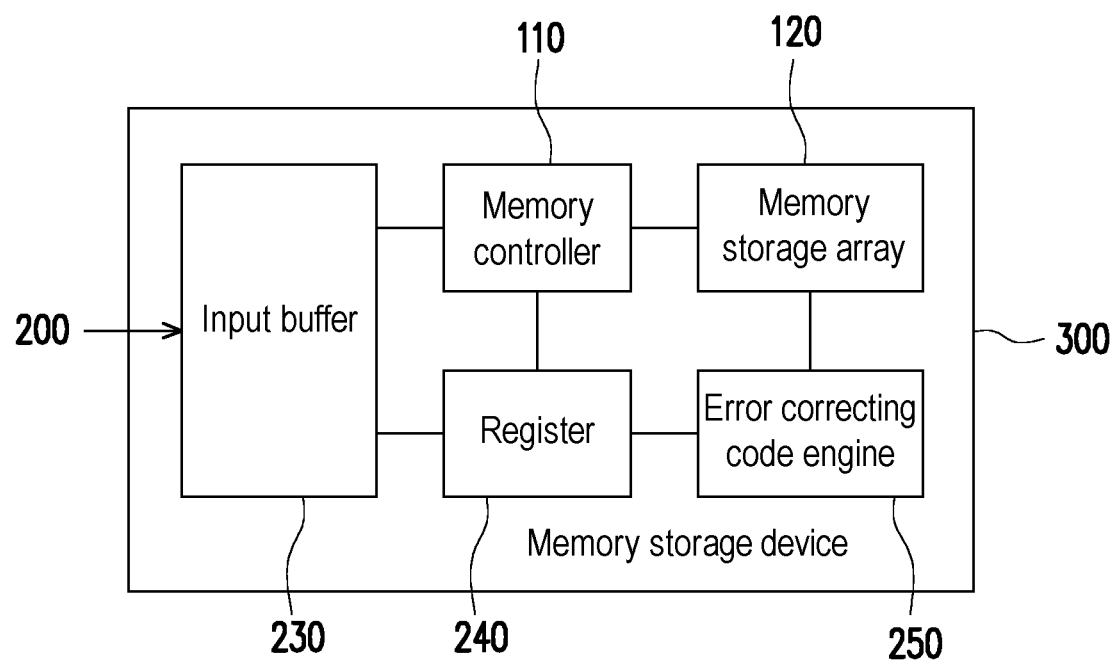
FIG. 3 shows a schematic overview diagram of a memory storage device according to another embodiment of the invention.

FIG. 3 shows a schematic overview diagram of a memory storage device according to another embodiment of the invention. Referring to FIG. 1 and FIG. 3, the memory storage device 300 of the present embodiment is similar to the memory storage device 100 in FIG. 1 except that the main difference lies in: For example, the memory storage device 300 further includes an input buffer 230, a register 240, and an error correcting code (ECC) engine 250.

In the present embodiment, the input buffer 230 is configured to store the to-be-written data 200. When the memory controller 110 performs a read operation on the memory storage array 120, the ECC engine 250 is configured to perform an error correction procedure on the read data. In the present embodiment, a correction capability of the ECC engine 250 is n bits, where n is a natural number. In an embodiment, n is, for example, 1 to 3. The register 240 is configured to store the information of the error bits. The memory controller 110 records the information of the error bits to the register 240. The register 240 is, for example, a volatile register/buffer, which is not limited in the invention. In the present embodiment, for the implementations of the input buffer 230, the register 240, and the ECC engine 250, sufficient demonstrations, suggestions, and implementation descriptions may be obtained from the ordinary skill in the art. Therefore, details are not described.

Figure 4:
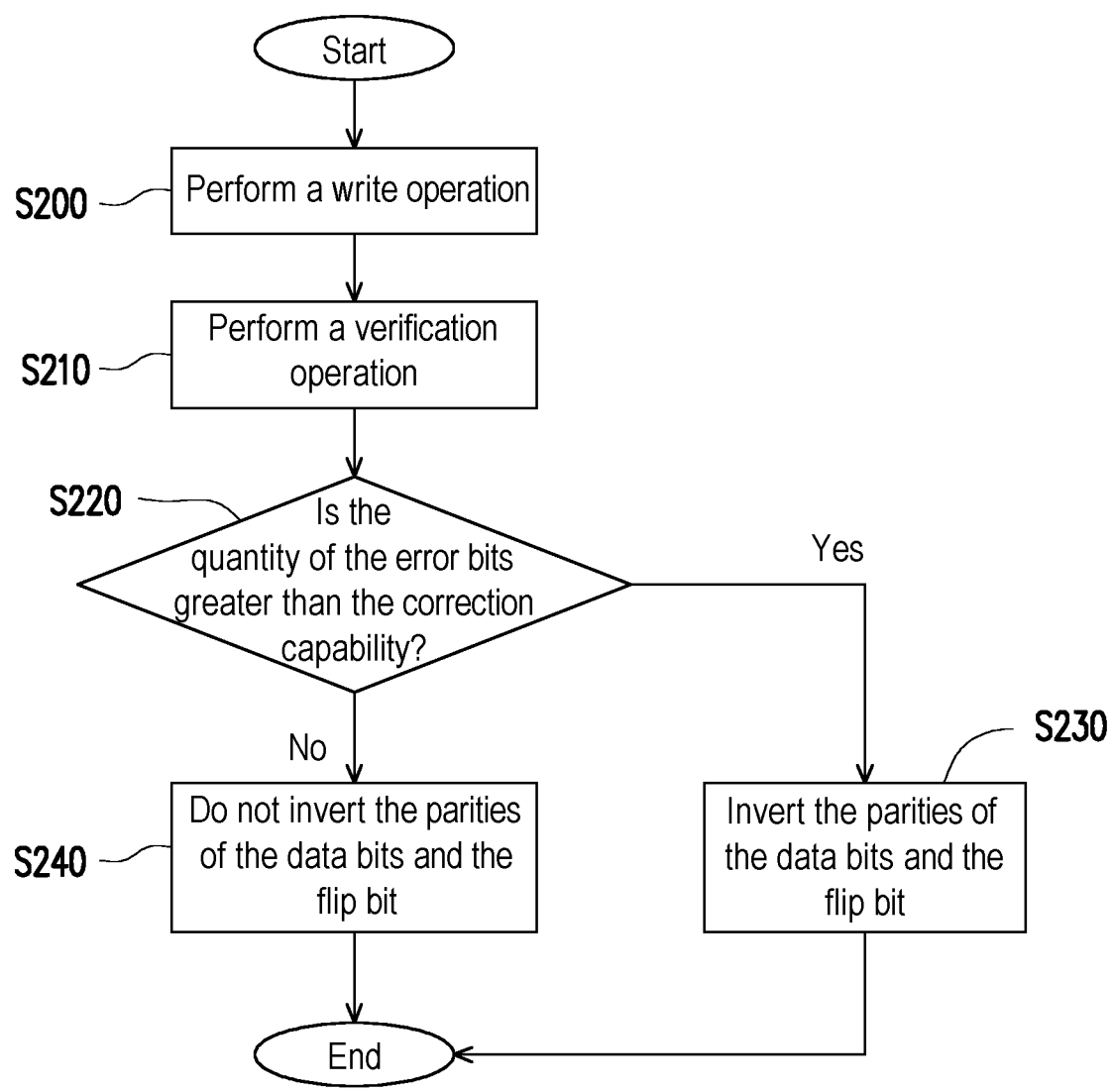
FIG. 4 shows a step flowchart of a data write method according to an embodiment of the invention.

FIG. 4 shows a step flowchart of a data write method according to an embodiment of the invention. The data write method of the present embodiment is at least applicable to the memory storage device 300 in FIG. 3, which is not limited in the invention. The following Table 1 is an implementation example of code words of the to-be-written data 200, but the invention is not limited thereto.

TABLE 1

| | Data bits | | |
|---|---|---|---|
| | Message bits | Parity bits | Flip bit |
| 1 | 11111111111111111111111111111111 | 111111111111111111 | 1 |
| 2 | 11110111101111111011111111110111 | 111111101111110111 | 1 |
| 3 | 00000000000000000000000000000000 | 000000000000000000 | 0 |
| 4 | 11111111111111111111111111111111 | 111111111111111111 | 0 |

In the present embodiment, the to-be-written data 200 includes 32 bits of message bits, 18 bits of parity bits, and 1 bit of flip bit, namely, code words of a total of 51 bits. The quantity and parities of the bits are only used for exemplary description, which is not limited in the invention. In the above Table 1, the first line represents the to-be-written data 200; the second line represents the information of the error bits of the to-be-written data 200, and the information of the error bits includes the quantity, the positions, and the parities of the error bits; the third line represents that some bits of the to-be-written data 200 are inverted; and the fourth line represents that all bits of to-be-read data are inverted.

Referring to FIG. 3 and FIG. 4, in step S200, the memory controller 110 needs to perform a write operation on the to-be-written data 200, and the to-be-written data 200 is as the first line shown in Table 1. In the present embodiment, after the to-be-written data 200 is input to the memory storage device 300, for example, the to-be-written data 200 is first stored in the input buffer 230 to be used by the memory controller 110 to perform a verification operation. In step S210, the memory controller 110 performs a verification operation on the to-be-written data 200 to determine whether the data bits include error bits and record information of the error bits. In the present embodiment, the memory controller 110 records the information of the error bits to the register 240. The information of the error bits includes the quantity, the positions, and the parities of the error bits. In this example, the quantity of the error bits is 6, and the positions and the parities are as the second line shown in Table 1.

In the present embodiment, a correction capability of the ECC engine 250 is 3 bits. In step S220, the memory controller 110 determines whether the quantity of the error bits is greater than the correction capability of the ECC engine 250. That is, the memory controller 110 determines whether the quantity of the error bits is greater than 3. In the present embodiment, the quantity of the error bits is 6. The memory controller 110 determines that the quantity of the error bits is greater than 3, and performs step S230, to invert the parities of the data bits and the flip bit, as the third line shown in Table 1, and the memory controller 110 records the parity of the flip bit as 0 (a first parity). Therefore, the memory controller 110 determines, according to the quantity of the error bits, whether to invert the parities of the data bits and the flip bit, and records the parity of the flip bit.

In the present embodiment, the memory controller 110 inverts the parity of the flip bit and parities of some data bits. For example, in step S230, the memory controller 110 maintains the parities of the error bits to be 0, and writes the error bits to the memory storage array 120. Simultaneously, the memory controller 110 inverts the parity of the flip bit and parities of other data bits than the error bits, for example, inverts the parities of from the parity 1 to the parity 0, and next writes the data bits and the flip bit that are inverted to the memory storage array 120, as the third line shown in Table 1. In the present embodiment, in the first and second lines of the Table 1, the parity of the flip bit is originally 1, and is inverted in step S230. Therefore, the memory controller 110 records the parity of the flip bit as 0.

On the other hand, when the quantity of the error bits is not greater than 3, the memory controller 110 performs step S240, and directly writes the to-be-written data 200 to the memory storage array 120 without inverting the parities of the data bits and the flip bit. Moreover, the memory controller 110 records the parity of the flip bit as 1 (a second parity), where the second parity is different from the first parity. In the first and second lines of Table 1, the parity of the flip bit is originally 1, and is not inverted in step S240. Therefore, the memory controller 110 records the parity of the flip bit as 1. The first parity and the second parity are 0 or 1, which is not used for limiting the invention.

Figure 5:
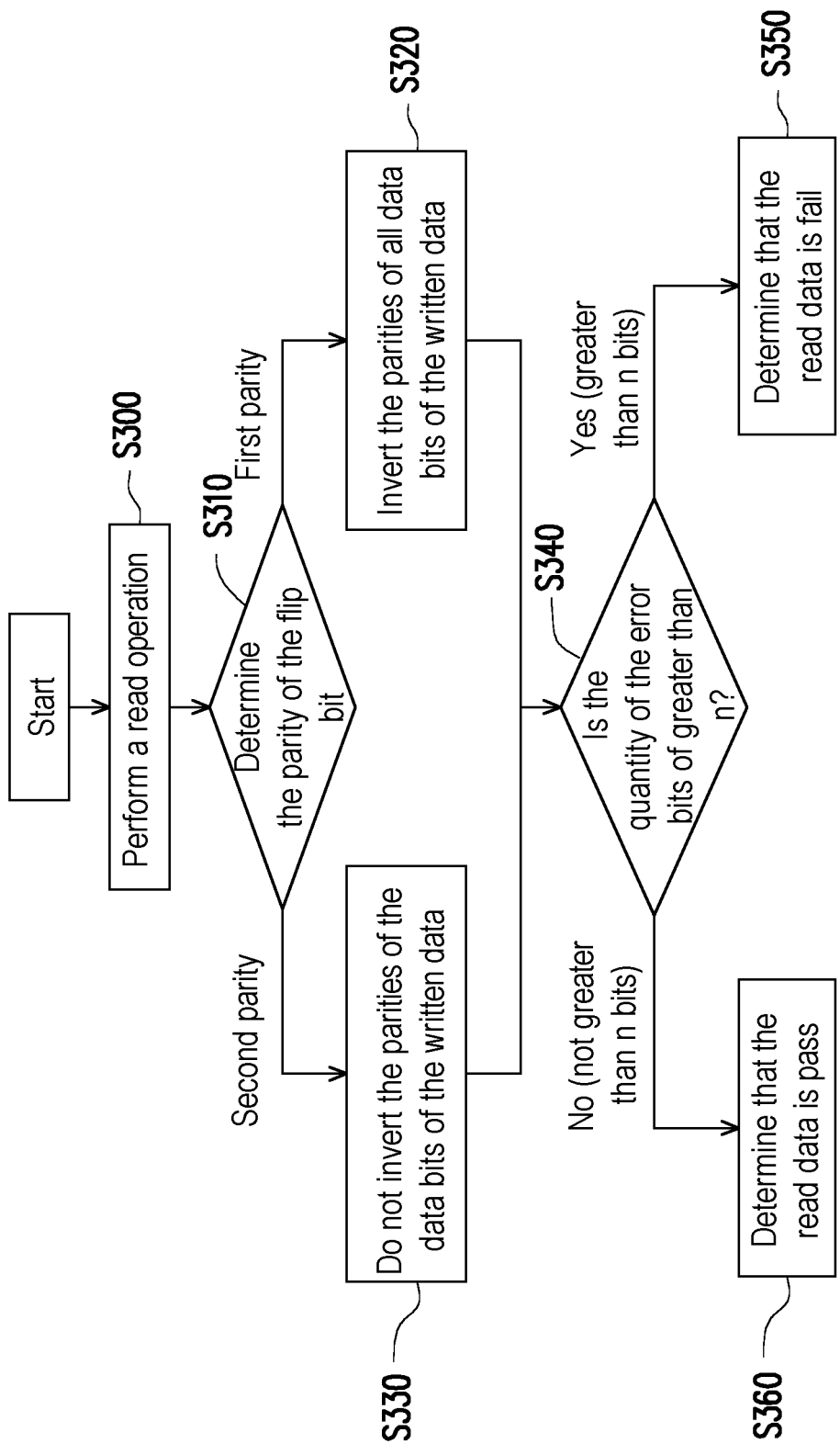
FIG. 5 shows a step flowchart of a data read method according to an embodiment of the invention.

FIG. 5 shows a step flowchart of a data read method according to an embodiment of the invention. The data read method of the present embodiment is at least applicable to the memory storage device 300 in FIG. 3, which is not limited in the invention. Referring to FIG. 3 and FIG. 5, in step S300, the memory controller 110 performs a read operation on the memory storage array 120. In step S310, the memory controller 110 determines the parity of the flip bit of the written data, and determines, according to the determining result, whether to invert parities of all data bits of the written data, and reads the data with the inverted parities.

For example, when the memory controller 110 determines that the parity of the flip bit is 0 (the first parity), the memory controller 110 performs step S320, inverts the parities of all data bits of the written data, as the fourth line shown in Table 1, and reads the data with the inverted parities. That is, when the parity of the flip bit is recorded as 0, it represents that when performing the read operation, the memory controller 110 inverts the parities of the all data bits, and reads the data (written data) stored in the memory storage array 120. Therefore, even if when the quantity of the error bits is greater than 3, the error bits may also be corrected.

On the contrary, when the memory controller 110 determines that the parity of the flip bit is 1 (the second parity), the memory controller 110 performs step S330, and directly reads the written data stored in the memory storage array 120 without inverting the parities of the data bits of the written data. That is, when the parity of the flip bit is recorded as 1, it represents that when performing the read operation, the memory controller 110 directly reads the data stored in memory storage array 120 without inverting the parities of the data bits. Therefore, when the quantity of the error bits is not greater than 3, the error bits may be corrected by the ECC engine 250.

Next, the ECC engine 250 receives the data (read data) read from the memory storage array 120, and the parity of the data may have been inverted or have not been inverted. In step S340, the ECC engine 250 determines whether the quantity of the error bits of the read data is greater than n. In this example, n is, for example, 3. When the quantity of the error bits of the read data is greater than n, in step S350, the memory controller 110 determines that the read data is fail. On the contrary, when the quantity of the error bits of the read data is not greater than n, in step S360, the ECC engine 250 performs an error correction procedure on the read data, and the memory controller 110 determines that the read data processed by the error correction procedure is pass.

Based on the above, in the embodiments of the invention, the memory storage device includes an input buffer, which may be configured to store to-be-written data. The to-be-written data includes at least one flip bit, used as an indicator bit, to indicate whether to invert data when the memory controller performs a data read operation, and then read the data. The memory storage device includes a register, configured to record information of error bits obtained after a verification operation is performed on the data, and the information includes a quantity, positions, and parities of the error bits. If the quantity of the error bits is not greater than the correction capability of the ECC engine, the memory controller directly writes the to-be-written data to the memory storage array without inverting the parities, and records the parity of the corresponding flip bit. If the quantity of the error bits is greater than the correction capability of the ECC engine, the memory controller inverts parities of some to-be-written data, maintains the parities of the error bits to be unchanged, then writes the data to the memory storage array, and records the parity of the corresponding flip bit. Next, when the memory controller needs to read the data, the memory controller determines, according to the parity of the flip bit, whether to invert the data and then read the data. By using the data access method, the memory storage device of the embodiments of the invention can increase the correction capability for the error bits in the data.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A memory storage device, comprising:
a memory storage array, configured to store data; and
a memory controller, coupled to the memory storage array and configured to write to-be-written data to the memory storage array, wherein the to-be-written data comprises a plurality of data bits and a flip bit, and the memory controller performs a verification operation on the to-be-written data to determine whether the data bits comprise error bits and record information of the error bits, wherein
the memory controller determines, according to quantity of the error bits, whether to invert parities of the data bits and the flip bit, and records the parity of the flip bit, wherein when the parities of the data bits and the flip bit are determined to be inverted, the memory controller maintains the parity of the error bits and writes the error bits to the memory storage array.

2. The memory storage device according to claim 1, further comprising a register, configured to store the information of the error bits, wherein the memory controller records the information of the error bits to the register.

3. The memory storage device according to claim 1, further comprising an error correcting code (ECC) engine, wherein a correction capability of the ECC engine is n bits, and the memory controller determines whether the quantity of the error bits is greater than n, wherein n is a natural number.

4. The memory storage device according to claim 3, wherein when the quantity of the error bits is greater than n, the memory controller inverts the parities of the data bits and the flip bit, and records the parity of the flip bit as a first parity.

5. The memory storage device according to claim 4, wherein when the quantity of the error bits is greater than n, the memory controller inverts parities of other data bits excluding the error bits and the parity of the flip bit, and writes the other data bits and the flip bit that are inverted to the memory storage array.

6. The memory storage device according to 4, wherein when the quantity of the error bits is not greater than n, the memory controller writes the to-be-written data to the memory storage array without inverting the parities of the data bits and the flip bit, and the memory controller records the parity of the flip bit as a second parity, wherein the second parity is different from the first parity.

7. The memory storage device according to claim 1, wherein the memory controller writes the to-be-written data to the memory storage array, and when the memory controller needs to read the written data, the memory controller determines the parity of the flip bit of the written data, determines, according to a determining result, whether to invert parities of all data bits of the written data, and reads data with the inverted parities.

8. The memory storage device according to claim 7, wherein when the memory controller determines that the parity of the flip bit is a first parity, the memory controller inverts the parities of all the data bits of the written data, and reads data with the inverted parities.

9. The memory storage device according to claim 7, wherein when the memory controller determines that the parity of the flip bit is a second parity, the memory controller does not invert the parities of the data bits of the written data, and reads the written data.

10. The memory storage device according to claim 7, further comprising an ECC engine, wherein a correction capability of the ECC engine is n bits,
the memory controller reads the written data, and the ECC engine determines whether the quantity of error bits of the read data is greater than n, wherein n is a natural number.

11. The memory storage device according to claim 10, wherein when the quantity of the error bits of the read data is greater than n, the memory controller determines that the read data is fail; and when the quantity of the error bits of the read data is not greater than n, the ECC engine performs an error correction procedure on the read data, and the memory controller determines the read data processed by the error correction procedure is pass.

12. A data access method of a memory storage device, comprising:
    performing a verification operation on to-be-written data to determine whether a plurality of data bits comprise error bits and record information of the error bits, wherein the to-be-written data comprises the data bits and a flip bit, and the information of the error bits comprises the quantity of the error bits;
    determining, according to the quantity of the error bits, whether to invert parities of the data bits and the flip bit, and recording the parity of the flip bit; and
    writing the to-be-written data to a memory storage array, wherein when the parities of the data bits and the flip bit are determined to be inverted, the step of inverting the parities of the data bits comprises maintaining parities of the error bits, and writing the error bits to the memory storage array.

13. The data access method according to claim 12, further comprising:
    determining whether the quantity of the error bits is greater than n, and a correction capability of an error correcting code (ECC) engine of the memory storage device is n bits, wherein n is a natural number.

14. The data access method according to claim 13, wherein when the quantity of the error bits is greater than n,
    in the step of determining, according to the quantity of the error bits, whether to invert the parities of the data bits and the flip bit, and recording the corresponding parity of the flip bit, the parities of the data bits are inverted, and the parity of the flip bit is recorded as a first parity.

15. The data access method according to claim 14, wherein when the quantity of the error bits is greater than n, the step of inverting the parities of the data bits further comprises:
    inverting parities of other data bits excluding the error bits and the parity of the flip bit, and writing the other data bits and the flip bit that are inverted to the memory storage array.

16. The data access method according to claim 14, wherein when the quantity of the error bits is not greater than n,
    in the step of determining, according to the quantity of the error bits, whether to invert the parities of the data bits and the flip bit, and recording the corresponding parity of the flip bit, the to-be-written data is written to the memory storage array without inverting the parities of the data bits and the flip bit, and the parity of the flip bit is recorded as a second parity, wherein the second parity is different from the first parity.

17. The data access method according to claim 12, further comprising:
    when the written data needs to be read, determining the parity of the flip bit of the written data and determining, according to a determining result, whether to invert parities of all data bits of the written data, and reading data with the inverted parities.

18. The data access method according to claim 17, wherein the step of determining the parity of the flip bit and determining, according to the determining result, whether to invert the parities of all the data bits comprises:
    when determining that the parity of the flip bit is a first parity, inverting the parities of all the data bits of the written data, and reading data with the inverted parities; and
    when determining that the parity of the flip bit is a second parity, skipping inverting the parities of the data bits of the written data, and reading the written data.

19. The data access method according to claim 17, further comprising:
    reading the written data, and determining whether the quantity of error bits of the read data is greater than n, wherein a correction capability of an ECC engine of the memory storage device is n bits, and n is a natural number.

20. The data access method according to claim 19, further comprising:
    when the quantity of the error bits of the read data is greater than n, determining that the read data is fail; and
    when the quantity of the error bits of the read data is not greater than n, performing an error correction procedure on the read data, and determining that the read data processed by the error correction procedure is pass.

* * * * *